United States Patent
Nishijima et al.

(10) Patent No.: US 10,658,212 B2
(45) Date of Patent: May 19, 2020

(54) RING SPACER

(71) Applicant: ACHILLES CORPORATION, Tokyo (JP)

(72) Inventors: Masayuki Nishijima, Tokyo (JP); Takayuki Tachikawa, Tokyo (JP)

(73) Assignee: ACHILLES CORPORATION, Tokyo (JP)

(*) Notice: Subject to any disclaimer, the term of this patent is extended or adjusted under 35 U.S.C. 154(b) by 16 days.

(21) Appl. No.: 15/529,684

(22) PCT Filed: Nov. 26, 2015

(86) PCT No.: PCT/JP2015/083179
§ 371 (c)(1),
(2) Date: May 25, 2017

(87) PCT Pub. No.: WO2016/084882
PCT Pub. Date: Jun. 2, 2016

(65) Prior Publication Data
US 2017/0330778 A1 Nov. 16, 2017

(30) Foreign Application Priority Data
Nov. 27, 2014 (JP) .................................. 2014-240117

(51) Int. Cl.
*H01L 21/673* (2006.01)
(52) U.S. Cl.
CPC .. *H01L 21/67369* (2013.01); *H01L 21/67346* (2013.01); *H01L 21/67386* (2013.01); *H01L 21/67366* (2013.01); *H01L 21/67383* (2013.01)
(58) Field of Classification Search
CPC ............. H01L 21/673; H01L 21/67369; H01L 21/67386; H01L 21/67383; H01L 21/67366; H01L 21/67346
(Continued)

(56) References Cited

U.S. PATENT DOCUMENTS

| 3,695,424 A * | 10/1972 | Cristy ............... B65D 21/0233 206/455 |
| 9,644,894 B2 * | 5/2017 | Torimi .................. F27D 5/0037 |
| 2005/0072121 A1 * | 4/2005 | Hortzleza ......... H01L 21/67346 53/447 |

(Continued)

FOREIGN PATENT DOCUMENTS

| JP | 2002-240883 A | 8/2002 |
| JP | 2004-022571 A | 1/2004 |

(Continued)

OTHER PUBLICATIONS

PCT/ISA/210, "International Search Report for International Application No. PCT/JP2015/083179," dated Mar. 1, 2016.

(Continued)

*Primary Examiner* — Jacob K Ackun
*Assistant Examiner* — Jenine Pagan
(74) *Attorney, Agent, or Firm* — Manabu Kanesaka

(57) ABSTRACT

A ring spacer interposed between plate-shaped objects above and below in a container for storing and transporting the plate-shaped objects when a plurality of plate-shaped objects is stored in an up-and-down direction includes a ring-shaped abutment portion and a control portion. An upper face and a lower face in the abutment portion have an approximately flat shape and the upper face in the abutment portion abuts against a lower face of a peripheral edge portion of the plate-shaped object. The lower face in the abutment portion abuts against an upper face of the peripheral edge portion of the plate-shaped object. The control portion includes a control portion upper face positioned to protrude further upward than the support face of the abutment portion and a control portion lower face positioned at an appropriate location in a thickness direction of the abutment portion.

3 Claims, 3 Drawing Sheets

(58) Field of Classification Search
USPC ....... 206/710, 701, 711, 712, 722, 723, 724,
206/499, 503, 509, 449, 455, 453, 414
See application file for complete search history.

(56) References Cited

U.S. PATENT DOCUMENTS

| | | | |
|---|---|---|---|
| 2007/0068846 A1* | 3/2007 | Hsiao | H01L 21/67383 206/710 |
| 2009/0196714 A1* | 8/2009 | Sylvestre | H01L 21/67383 414/217.1 |
| 2010/0224517 A1* | 9/2010 | Haggard | H01L 21/67369 206/308.1 |
| 2012/0205282 A1 | 8/2012 | Pylant et al. | |
| 2013/0252424 A1* | 9/2013 | Lin | H01L 21/68735 438/689 |
| 2015/0249025 A1* | 9/2015 | Torimi | F27D 5/0037 432/198 |
| 2016/0365265 A1 | 12/2016 | Kirkland et al. | |

FOREIGN PATENT DOCUMENTS

| | | |
|---|---|---|
| JP | 2007-281052 A | 10/2007 |
| JP | 2009-035300 A | 2/2009 |
| JP | 2009-105116 A | 5/2009 |
| JP | 2009-540556 A | 11/2009 |
| WO | 2015/130690 A1 | 9/2015 |

OTHER PUBLICATIONS

Japan Patent Office, "Office Action for Japanese Patent Publication No. 2016-561936," dated Jun. 19, 2018.

* cited by examiner

RING SPACER

RELATED APPLICATIONS

The present application is National Phase of International Application No. PCT/JP2015/083179 filed Nov. 26, 2015, and claims priority from Japanese Application No. 2014-240117, filed Nov. 27, 2014, the disclosure of which is hereby incorporated by reference herein in its entirety.

FIELD OF TECHNOLOGY

The present invention relates to a ring spacer.

BACKGROUND ART

Conventionally, when a plate-shaped object such as a glass substrate, a semiconductor wafer, or the like is transported, the plate-shaped object is stored in a coin-stack-type (horizontal placement) transport container, and is transported.

As for the coin-stack-type transport container, for example, there is known a coin-stack-type transport container wherein a container lid is covered on a container main member as described in Patent Document 1, and inside the container thereof, there are provided cushion materials in a lowermost step and an uppermost step, and there is stored a plurality of plate-shaped objects such as the semiconductor wafer and the like between the cushion materials thereof. Also, a spacer sheet is interposed respectively between upper and lower adjacent plate-shaped objects, and the spacer sheet suppresses damage to the plate-shaped objects due to vibration or impact during transportation.

PRIOR ART DOCUMENT

Patent Document

Patent Document 1: Japanese Unexamined Patent Application Publication No. 2002-240883

SUMMARY OF THE INVENTION

Problems to be Solved by the Invention

Recently, however, since a cover glass (glass substrate) for an image sensor surface, or the semiconductor wafer having a 3DS-IC structure, specifically, the semiconductor wafer having a surface with a formation of a micro-bump, or an exposure of a TSV terminal, respectively include a very minute structure. As a result, if, for example, the spacer sheet directly contacts a surface of the plate-shaped object such as the cover glass, the semiconductor wafer, or the like, one portion of the spacer sheet transfers, or is rubbed and damaged so as to cause concern that the plate-shaped object might be damaged.

Therefore, an object of the present invention is to remove the aforementioned concern, and to provide a ring spacer which can transport the plate-shaped object, for example, such as the cover glass for the image sensor surface, the semiconductor wafer having the 3DS-IC structure, or the like while suppressing transfer or damage to the surface of the plate-shaped object, even in a case wherein the plate-shaped object is stored in the container and transported.

Means for Solving the Problems

In order to obtain the aforementioned object, a ring spacer according to the first aspect of the present invention is a ring spacer interposed between plate-shaped objects above and below in a container for storing and transporting the plate-shaped object when a plurality of plate-shaped objects is stored in an up-and-down direction. The ring spacer comprises at least a ring-shaped abutment portion and a control portion. An upper face and a lower face in the abutment portion have an approximately flat shape. The upper face in the abutment portion abuts against a lower face of a peripheral edge portion of the plate-shaped object, and is a support face for supporting the lower face of the peripheral edge portion of the plate-shaped object. The lower face in the abutment portion abuts against an upper face of the peripheral edge portion of the plate-shaped object, and is a pressing face for pressing the upper face of the peripheral edge portion of the plate-shaped object. The control portion is positioned further outward than an outer contour of the plate-shaped object in a plan view, and includes a control portion upper face positioned to protrude further upward than the support face of the abutment portion; and a control portion lower face positioned at an appropriate location in a thickness direction of the abutment portion. The control portion controls a movement in a horizontal direction of the plate-shaped object. The abutment portion abuts against the lower face of the peripheral edge portion of the plate-shaped object and operates as the support face for supporting the lower face of the peripheral edge portion of the plate-shaped object; and abuts against the upper face of the peripheral edge portion of the plate-shaped object and operates as the pressing face for pressing the upper face of the peripheral edge portion of the plate-shaped object.

Effect of the Invention

The ring spacer of the present invention can transport the plate-shaped object such as, for example, a cover glass for an image sensor surface, a semiconductor wafer having a 3DS-IC structure, or the like while suppressing transfer or damage to a surface of the plate-shaped object, even in a case wherein the plate-shaped object is stored in the container and transported.

BEST MODES OF CARRYING OUT THE INVENTION

[Ring Spacer]

Figure 1:
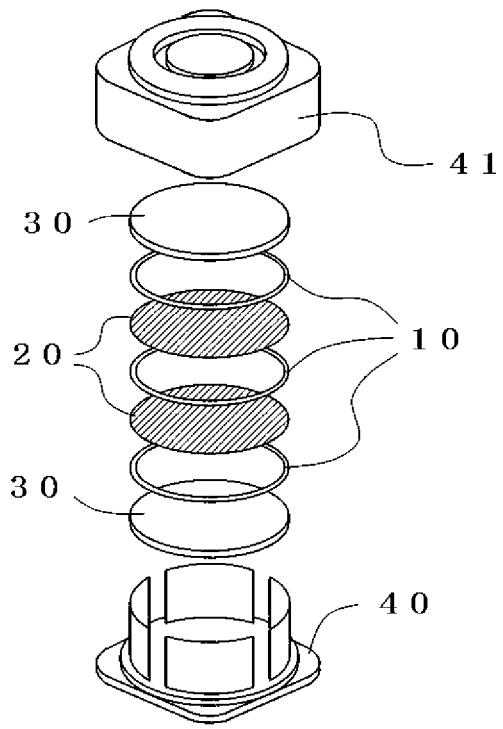
FIG. 1 is a drawing for explaining a state wherein a plate-shaped object or the like is stored in a transport container.

As shown in FIG. 1, a ring spacer 10 of the present invention is used by being interposed between plate-shaped objects 20 to be stored above and below in a container for storing the plate-shaped objects 20 and transporting when a plurality of plate-shaped objects 20 is stored in an up-and-down direction.

Also, as shown in FIG. 2 to FIG. 4(D), the ring spacer of the present invention comprises at least a control portion 11 and a ring-shaped abutment portion 12. The control portion 11 is positioned further outward than an outer contour of the plate-shaped object 20 in a plan view, namely, positioned on the outermost periphery of the ring spacer 10, and has a structure of including a control portion upper face 11a positioned to protrude further upward than a support face 12a of the abutment portion 12; and a control portion lower face 11b positioned at an appropriate location in a thickness direction of the abutment portion 12 so as to control a movement in a horizontal direction of the plate-shaped object 20.

The ring-shaped abutment portion 12 is positioned further inward than the control portion 11, namely, on an inner peripheral side of the control portion 11, and the upper face 12a and a lower face 12b in the abutment portion 12 have an approximately flat shape. The upper face 12a in the abutment portion 12 abuts against a lower face of a peripheral edge portion of the plate-shaped object and operates as the support face 12a for supporting the lower face of the peripheral edge portion of the plate-shaped object. The lower face 12b in the abutment portion abuts against an upper face of the peripheral edge portion of the plate-shaped object and operates as a pressing face 12b for pressing the upper face of the peripheral edge portion of the plate-shaped object.

Incidentally, the "outward" here represents a direction of separating outward from a center of the ring spacer 10, and the "inward" here represents a direction of moving to the center of the ring spacer.

[Control Portion]

The control portion 11 in the ring spacer 10 of the present invention is positioned further outward than the outer contour of the plate-shaped object 20 in the plan view, and is a portion for controlling the movement in the horizontal direction of the plate-shaped object 20. Therefore, the upper face 11a of the control portion 11 protrudes further upward than the upper face (support face) 12a in the ring-shaped abutment portion, and a height thereof (namely, a thickness of the control portion 11) is larger than a thickness of the plate-shaped object 20.

Figure 2:
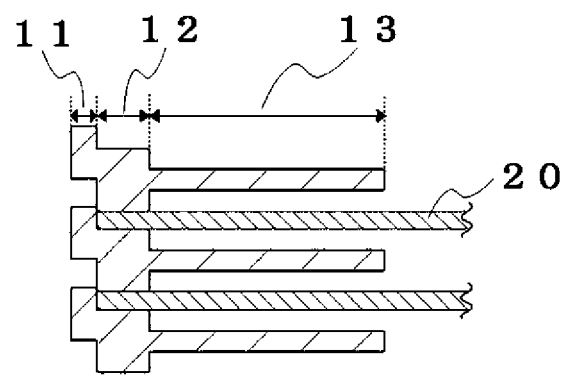
FIG. 2 is a drawing for explaining a stored state of the plate-shaped object and a ring spacer when a plurality of plate-shaped objects is stored in the transport container.

However, if the height of the control portion upper face 11a is too high, before the pressing face 12b of the ring spacer 10 adjacent above abuts (contacts) against the upper face of the peripheral edge portion of the plate-shaped object 20, the control portion upper face 11a and the control portion lower face 11b happen to contact each other so as to become difficult to restrict the plate-shaped object 20 from moving in the up-and-down direction. Therefore, as shown in FIG. 2, it is preferred that the height is adjusted so that the control portion upper face 11a and the lower face 11b do not come in contact with each other in a transport container.

Figure 3:
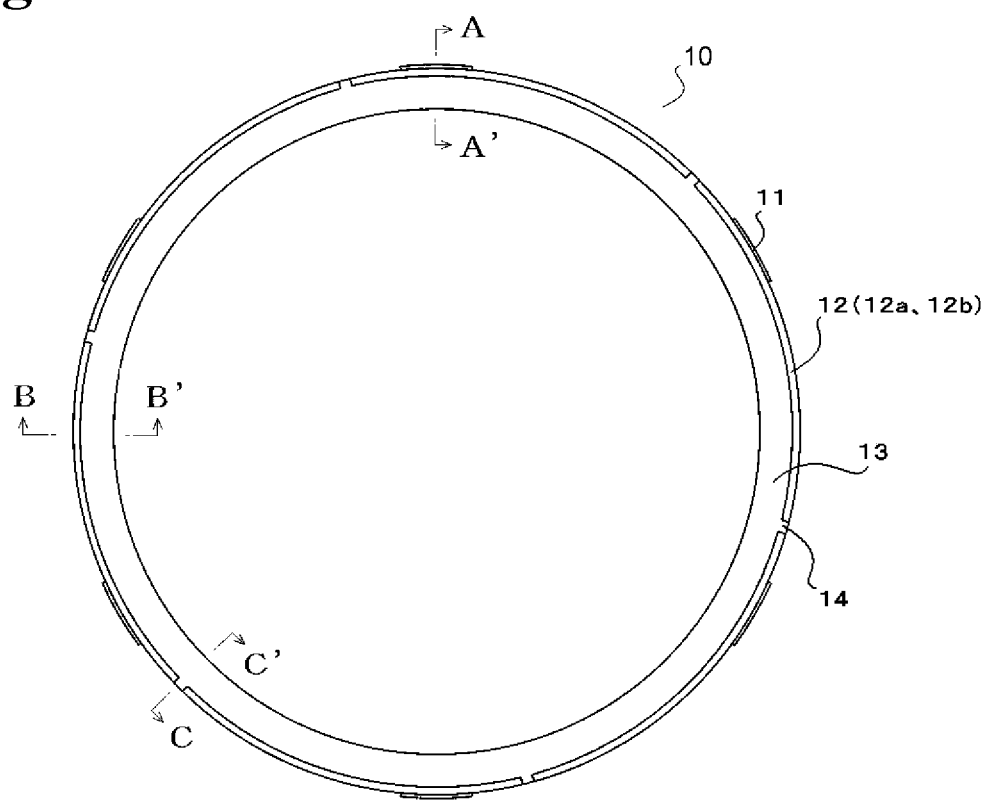
FIG. 3 is a plan view of the ring spacer of the present invention.

Also, as shown in FIG. 3, the control portion 11 may be discontinuously provided on the outermost periphery of the ring spacer 10, namely, outward the abutting portion 12 along an outer periphery of the abutment portion 12, or although it is not shown in the drawings, the control portion 11 can be continuously provided as well.

As shown in FIG. 3, if the control portion 11 is discontinuously provided, a contact between the ring spacer 10 and a container main member 40 is reduced, and when the ring spacer 10 is stored in the container main member 40, or when the ring spacer 10 is removed from the container main member 40, rubbing between the container main member 40 and the ring spacer 10 can be reduced, and as a result, a foreign material (particle) generated from the container can be reduced.

A size, i.e. length, of the control portion 11 when the control portion 11 is formed in a discontinuous state is not specifically limited provided that the control portion 11 can limit the movement in the horizontal direction of the plate-shaped object 20, and the contact with the container main member 40 can be minimized, however, the size, i.e. length, of the control portion 11 in the discontinuous state may practically have about 10 to 50 percent relative to a perimeter of the abutment portion 12.

Figure 4A:
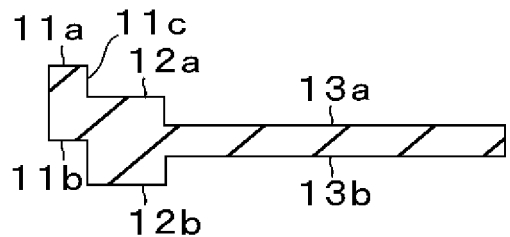
FIG. 4(A) is an end face enlarged view wherein an A-A' portion in FIG. 3 is cut out.
Figure 4B:
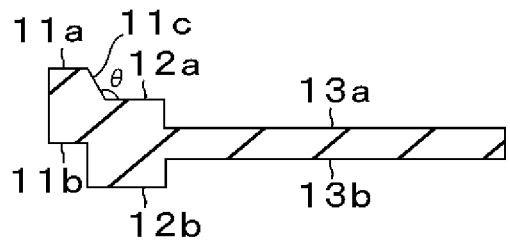
FIG. 4(B) to FIG. 4(D) are end face enlarged views for explaining another example of the same portion.
Figure 4C:
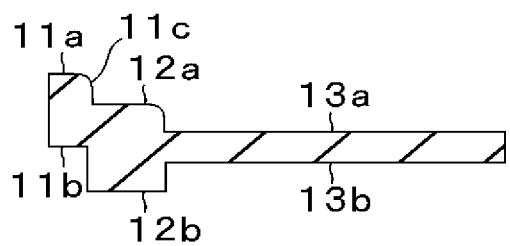
Figure 4D:
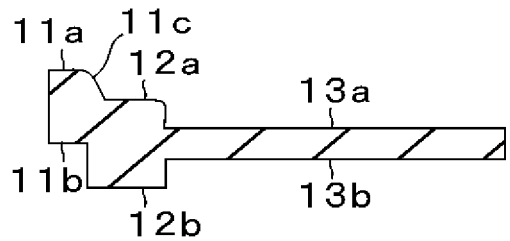
Figure 5:
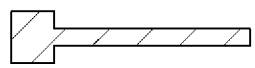
FIG. 5 is an end face enlarged view wherein a B-B' portion in FIG. 3 is cut out.
Figure 6:
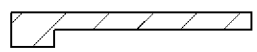
FIG. 6 is an end face enlarged view wherein a C-C' portion in FIG. 3 is cut out.

Also, an inward face 11c of the control portion 11 contacting a side face (the outer contour of the plate-shaped object in the plan view) of the plate-shaped object 20 may have a flat shape as shown in FIG. 4(A); may have a taper at an inclination angle θ>90° toward the upper face 11a of the control portion 11 from the support face 12a of the abutment portion 12 as shown in FIG. 4(B); or may have three corner portions in FIG. 4(A) or FIG. 4(B) with a rounded shape as shown in FIG. 4(C) or FIG. 4(D).

[Abutment Portion]

In the ring-shaped abutment portion 12 in the ring spacer 10 of the present invention, the upper face and the lower face in the abutment portion 12 have the approximately flat shape, and the upper face (support face) 12a in the abutment portion abuts against the lower face of the peripheral edge portion of the plate-shaped object 20 and operates as the support face for supporting the lower face of the peripheral edge portion of the plate-shaped object. The lower face (pressing face) 12b in the abutment portion abuts against the upper face of the peripheral edge portion of the plate-shaped object 20 and operates as the pressing face for pressing the upper face of the peripheral edge portion of the plate-shaped object.

Then, a location of the support face 12a in the abutment portion 12 is preferred to be located lower than the control portion upper face 11a and higher than the later-described suction portion upper face 13a. Also, a location of the pressing face 12b in the abutment portion 12 is preferred to be located below the control portion 11 lower face and an suction portion lower face 13b.

(Support Face)

As shown in FIG. 2, the support face 12a in the ring-shaped abutment portion 12 of the present invention is a face for supporting by abutting only against the lower face of the peripheral edge portion of the plate-shaped object 20. As a result, for example, in a case wherein the plate-shaped object 20 is a semiconductor wafer, a circuit formation face, and in a case wherein the plate-shaped object 20 is a glass substrate, a formation face of a concave and convex pattern and the like, i.e., a face other than the peripheral edge portion of the plate-shaped object 20, and the ring spacer 10 can be stored in the container in a non-contact state. Accordingly, one portion of the ring spacer 10 does not transfer to a surface of a used face in the plate-shaped object 20, and damage can be suppressed as well during transportation.

As shown in FIG. 3, the support face 12a may be provided in a discontinuous state through air holes 14 along an outer periphery of the ring spacer 10, or although it is not shown in the drawing, the support face 12a may be provided in a continuous state without providing the air hole 14.

Also, as for a size of the air hole 14, a length direction is 1 mm to 3 mm, and a width direction is not specially limited provided that air can flow in and out.

A width of the support face 12a shown in FIG. 2, i.e., a width abutting against the lower face of the peripheral edge portion of the plate-shaped object 20 to support is preferred to be 1 mm to 3 mm. If the width thereof is less than 1 mm, there is a case wherein the support face 12a becomes insufficient for supporting the plate-shaped object 20, and cannot maintain a horizontal state of the plate-shaped object 20, so that at the time of transportation, the ring spacer 10 contacts the plate-shaped object 20 so as not to suppress transfer or damage. If the width thereof exceeds 3 mm, there is a case wherein the support face 12a happens to contact the circuit formation face or a processing surface.

Also, a shape of a face abutting against the lower face of the peripheral edge portion of the plate-shaped object 20 in the support face 12a may be the flat shape, for example, as shown in FIG. 2, and FIG. 4(A) to FIG. 6, or although it is not shown in the drawings, in order to minimize a contact portion with the plate-shaped object 20, the shape may be the approximately flat shape including a minute concave and convex shape as well provided that the shape has the approximately flat shape.

(Pressing Face)

The pressing face 12b in the ring-shaped abutment portion 12 of the present invention is the face abutting against the upper face of the peripheral edge portion of the plate-shaped object 20 stored below as shown in FIG. 2. As a result, the plate-shaped object 20 can be suppressed from moving in the up-and-down direction in the transport container during the transportation.

Incidentally, as shown in FIG. 2, the width of the pressing face 12b may be the same as the width of the support face 12a, or although it is not shown in the drawing, the width of the pressing face 12b may be narrower or wider than the width of the support face 12a as well.

The pressing face 12b may be provided in the discontinuous state through the air hole 14 as in the case of the support face 12a as well, or although it is not shown in the drawing, the pressing face 12b may be provided in the continuous state without providing the air hole 14 as well.

Also, as for the size of the air hole 14, the length direction is 1 mm to 3 mm, and the width direction is not specially limited provided that air can flow in and out.

Incidentally, in the ring spacer 10 shown in FIG. 3, the upper face (surface) and an opposite face thereof (lower face or bottom face) are represented identically so as to be explained with the same drawing.

A portion contacting the plate-shaped object 20 of the pressing face 12b may be, for example, the flat shape, or the approximately flat shape comprising the minute concave and convex shape as well provided that the portion has the approximately flat shape as in the case of the support face 12a.

[Suction Portion]

The ring spacer 10 of the present invention may comprise an suction portion 13 in the continuous state further inward than the abutment portion 12 as well. By providing the suction portion 13, the ring spacer 10 can be stored into the transport container, or removed from the transport container by an suction device. For example, in a case wherein the ring spacer 10 is stored in the transport container, or the ring spacer 10 is removed from the transport container, the suction portion 13 of the ring spacer 10 can be absorbed by the suction device, and the ring spacer 10 can be automatically stored into the transport container, or removed from the transport container.

[Air Holes]

For example, as shown in FIG. 3, in the ring spacer 10 of the present invention, the abutment portion 12 is formed in the discontinuous state with gaps, and the gaps thereof are made as the air holes 14, so that when the ring spacer 10 or the plate-shaped object 20 is removed from the transport container, the ring spacer 10 and the plate-shaped object 20 can be easily separated. Especially, the air holes 14 are provided at three or more locations, so that the ring spacer and the plate-shaped object 20 can be easily separated respectively independently.

[Materials for the Ring Spacer]

The ring spacer 10 of the present invention can be formed by injection molding, vacuum forming, pressure forming, and the like of synthetic resins. As for the synthetic resins, there can be listed polypropylene-based resin, polystyrene-based resin, ABS-based resin, polycarbonate-based resin, polyacetal-based resin, polyphenylene ether-based resin, polyether nitrile-based resin, polyphenylene sulfide-based resin, polyphthalamide-based resin, polyarylate-based resin, polysulfone-based resin, polyethersulfone-based resin, polyetherimide-based resin, liquid crystal polymer-based resin, polyether ether ketone-based resin, and the like.

Also, a conductive filler or an anti-static agent may be contained in the synthetic resins, or a conductive treatment may be carried out to the surface of the ring spacer 10 after molding so that a surface resistance value of the ring spacer 10 becomes $10^1 \Omega$ to $10^{12} \Omega$. Incidentally, as for the conductive filler, there can be used carbon black, graphite carbon, graphite, carbon fiber, metal powder, metallic fiber, metallic oxide powder, inorganic fine powder coated with metal, organic fine powder, and fiber. As for the conductive treatment, there can be listed a treatment of forming a film wherein a conductive polymer is directly polymerized on the surface of the ring spacer 10 after molding, or a treatment of coating a paint including the conductive polymer and a binder resin.

[Plate-Shaped Object]

The plate-shaped object 20 is the glass substrate, the semiconductor wafer, and the like, and a shape thereof usually has a circular shape.

Incidentally, in a case wherein the plate-shaped object is the semiconductor wafer, there is a case wherein a circuit pattern is formed on both faces, however, even in that case, by using the ring spacer 10 of the present invention, the semiconductor wafer can be transported while suppressing the transfer or damage to both surfaces of the semiconductor wafer wherein the circuit pattern is formed on both faces.

[Transport Container]

As shown in FIG. 1, the transport container has a contour of a column shape with a low height including a bottom face of an approximately circular shape in a state wherein a container lid member 41 is mounted on the container main member 40. Incidentally, as described in Japanese Patent No. 4562930, the transport container may be a container having a contour of a rectangular column shape with a low height including a bottom face of an approximately rectangular shape in the state wherein the container lid member is mounted on the container main member.

Incidentally, as shown in FIG. 1, cushion materials may be provided in a lowermost step and an uppermost step inside the transport container as well, and in some cases, the cushion material may not be provided.

Also, the container main member 40 and the container lid member 41 are integrally molded by the injection molding as a material of conductive plastics wherein the conductive filler or the anti-static agent is added, or conductive plastics wherein a polymer alloy is treated. Incidentally, as for the conductive filler to be added, there can be used carbon black, graphite carbon, graphite, carbon fiber, metal powder, metallic fiber, metallic oxide powder, inorganic fine powder coated with metal, organic fine powder, and fiber.

Also, for example, in a case wherein a plurality of plate-shaped objects 20 is superposed and stored in the transport container, as shown in FIG. 1, the cushion materials 30 are disposed in the lowermost step and the uppermost step, and the plurality of plate-shaped objects 20 is disposed between the cushion materials 30 thereof so as to be stored in the container main member 40 in such a way as to interpose the ring spacers 10 above and below the respective plate-shaped objects 20, and the container lid member 41 is mounted on the stored container main member 40 thereof.

Incidentally, a metal fitting may be separately attached (not shown in the drawing) to a notch portion provided in the container main member, and after mounting the container lid member on the container main member, the container lid member may be firmly fixed by the metal fitting.

[Cushion Materials]

The cushion materials 30 can be disposed and stored in the lowermost step and the uppermost step inside the transport container. As for materials for the cushion material 30, there can be used flexible polyurethane foam, polyethylene foam, polypropylene foam, and polystyrene foam.

Also, conductivity can be provided to the cushion material 30 as well, and it is preferable that the surface resistance is $10^{12} \Omega$ or below.

PRACTICAL EXAMPLE

[Production of the Ring Spacer]

Injection molding was carried out to polycarbonate resin (Panlite L-1225L manufactured by Teijin Chemicals Ltd.), and a ring spacer having a shape shown in FIG. 3, FIG. 4(A), and FIG. 5 to FIG. 6 was obtained.

Regarding the obtained ring spacer, a drop test and a transfer test were conducted. A test method is as follows.

[Drop Test]

In the container main member 40 as shown in FIG. 1, there were alternately and repeatedly stored the cushion material 30, the ring spacer 10, the plate-shaped object 20 (semiconductor wafer), the ring spacer 10, the plate-shaped object 20 (semiconductor wafer), and the ring spacer 10. Also, the cushion material 30 was placed on the ring spacer 10 in the uppermost portion to prepare the transport container (transport container with the column shape having an outer diameter, 226 mm, and a height, 103 mm) wherein the container lid member 41 was mounted. Incidentally, in the transport container comprising the container main member 40 and the container lid 41, there were stored a total of 14 pieces of the ring spacers, and 13 pieces of the plate-shaped objects (semiconductor wafers) respectively.

Then, the transport container was covered using two pieces of buffer materials (PP Packing: MA-8PP manufactured by Achilles Corporation) of the transport container, and the covered transport container was inserted into a cardboard box (cardboard box having a rectangular parallelepiped shape with external sizes: length 305 mm; width 305 mm; and height 235 mm).

Then, a drop test was conducted to the cardboard box into which the transport container and the two pieces of buffer materials were inserted in conformity with ISO 2248. Specifically, using a drop tester (DTS-100 manufactured by Shinyei Technology Co., Ltd.), the cardboard box was dropped freely (a dropping direction: one angle, three crests, and six faces) from heights of 100 cm and 120 cm. After that, all the plate-shaped objects 20 (semiconductor wafers) were taken out of the transport container, and conditions of the plate-shaped objects 20 (semiconductor wafers) were visually observed.

As a result, all the plate-shaped objects 20 (semiconductor wafers) were not damaged.

[Transfer Test]

The transport container in the same storing mode as the aforementioned drop test was prepared, and the transport container in this mode was kept for six months. After that, all the plate-shaped objects 20 (semiconductor wafers) were taken out of the transport container, and surfaces of the plate-shaped objects 20 (semiconductor wafers) were observed by a laser microscope (VK-8500 manufactured by Keyence Corporation).

As a result, a foreign material (one portion of a material forming the ring spacer 20) was not transferred to the surfaces of the plate-shaped objects 20.

EXPLANATION OF SYMBOLS 10 a ring spacer
11 a control portion
11a a control portion upper face
11b a control portion lower face
11c a control portion inward face
12 a ring-shaped abutment portion
12a a support face (upper face in the ring-shaped abutment portion)
12b a pressing face (lower face in the ring-shaped abutment portion)
13 an suction portion
13a an suction portion upper face
13b an suction portion lower face
14 air holes
20 plate-shaped objects
30 cushion materials
40 a container main member
41 a container lid member

What is claimed is:
1. A combination, comprising: a pair of ring spacers, and a plate-shaped object,
the pair of ring spacers comprising:
an upper ring spacer and a lower ring spacer arranged in an up-and-down direction, and sandwiching the plate-shaped object therebetween in a container for storing and transporting the plate-shaped object when the plate-shaped object is stored in the up-and-down direction, each of the upper ring spacer and the lower ring spacer including
a ring-shaped abutment portion having an upper face, and a lower face,
a control portion integrally formed with the abutment portion and arranged outside the abutment portion to control a lateral movement of the plate-shaped object when the plate-shaped object is stored in the up-and-down direction, the control portion having a control portion upper face located above the upper face of the abutment portion, a control portion lower face located between the upper face and the lower face of the abutment portion, and an outer side face extending between the control portion upper face and the control portion lower face in a direction substantially perpendicular to the upper face and the lower face of the abutment portion and the control portion upper face and the control portion lower face of the control portion, and a suction portion arranged inside the abutment portion, wherein each of the upper face and the lower face of the abutment portion has a flat shape, and the control portion is circumferentially formed in a discontinuous state and a length of the control portion in the discontinuous state is 10 to 50 percent relative to a perimeter of the abutment portion, the upper face of the abutment portion of the lower ring spacer abuts against a lower face of a peripheral edge portion of the plate-shaped object, and is a support face for supporting the lower face of the peripheral edge portion of the plate-shaped object, the lower face of the abutment portion of the upper ring spacer abuts against an upper face of the peripheral edge portion of the plate-shaped object, and is a pressing face for pressing the upper face of the peripheral edge portion of the plate-shaped object, the control portion upper face of the lower ring spacer is arranged to be spaced from the control portion lower face of the upper ring spacer without contacting each other, the control portion further includes an inner side face extending between the control portion upper face and the upper face of the abutment portion at a side opposite to the outer side face, and the abutment portion further includes another outer side face extending between, the control portion lower face and the lower face of the abutment portion in the up-and-down direction, the plate-shaped object is supported on the upper face of the abutment portion of the lower ring spacer and pressed by the lower face of the abutment portion of the upper ring spacer, the control portion upper face of the lower ring spacer is located at a position higher than the plate-shaped object in the up-and-down direction, and the inner side face of the control portion of the lower ring spacer entirely holds an outer peripheral face of the plate-shaped object in the up-and-down direction so that a horizontal movement of the plate-shaped object is restricted inside the inner side face of the control portion of the lower ring spacer, and the lower face of the abutment portion of the upper ring spacer is located between the control portion upper face and the upper face of the abutment portion of the lower ring spacer in the up-and-down direction so that a horizontal movement of the upper ring spacer is restricted when the upper ring spacer is stacked on the lower ring spacer.

2. A combination according to claim 1, wherein the abutment portion of the upper ring spacer is arranged such that the lower face of the abutment portion of the upper ring spacer is located at a position lower than the control portion upper face of the lower ring spacer in the up-and-down direction, and the outer side face of the abutment portion of the upper ring spacer abuts against the inner side face of the control portion of the lower ring spacer to restrict the horizontal movement of the upper ring spacer.

3. A combination according to claim 2, wherein the control portion and the abutment portion of each of the upper ring spacer and the lower ring spacer are directly connected to each other.

* * * * *